United States Patent
Stamper et al.

[11] Patent Number: 5,849,629
[45] Date of Patent: Dec. 15, 1998

[54] METHOD OF FORMING A LOW STRESS POLYCIDE CONDUCTORS ON A SEMICONDUCTOR CHIP

[75] Inventors: Anthony Kendall Stamper, Williston; Gary Lionel Langdeau, Burlington; Richard John Lebel, Colchester, all of Vt.

[73] Assignee: International Business Machines Corporation, Armonk, N.Y.

[21] Appl. No.: 551,092

[22] Filed: Oct. 31, 1995

[51] Int. Cl.$^6$ .................................................. H01L 21/70
[52] U.S. Cl. ........................ 438/491; 438/491; 438/253; 438/418; 438/417; 438/592; 438/657; 438/658; 438/659; 438/396
[58] Field of Search .................................. 437/233, 193, 437/200; 438/419, 253, 418, 417, 592, 657, 658, 659, 396

[56] References Cited

U.S. PATENT DOCUMENTS

| | | | |
|---|---|---|---|
| 4,910,576 | 3/1990 | Campbell et al. | 357/59 |
| 5,067,218 | 11/1991 | Williams | 29/25.01 |
| 5,147,820 | 9/1992 | Chittipeddi | 437/192 |
| 5,168,076 | 12/1992 | Godinho et al. | 438/643 |
| 5,232,874 | 8/1993 | Rhodes | 437/195 |
| 5,256,894 | 10/1993 | Shino | 257/388 |
| 5,304,504 | 4/1994 | Wei et al. | 437/44 |
| 5,327,624 | 7/1994 | Hirayma | 29/25.01 |
| 5,429,979 | 7/1995 | Lee et al. | 438/253 |
| 5,578,516 | 11/1996 | Chou | 438/253 |
| 5,637,903 | 6/1997 | Liao et al. | 438/217 |

OTHER PUBLICATIONS

Beinglass, et al. "Integrated System for Deposition of Polysilicon and WSix Films"Microelectronic Engineering 25 (1994) 201–208.

Anonymously "Process for Improved CVD Silicide Adhesion to Doped Silicon" Research Disclosure, May 1988, No. 289.

"Integrated In–Situ Doped Polysilicon/Tungsten Silicide Gate Conductor" IBM Technical Disclosure, vol. 38, No. 06, Jun. 1995.

*Primary Examiner*—Charles Bowers
*Assistant Examiner*—Thanh Nguyen
*Attorney, Agent, or Firm*—Howard J. Walter, Jr.

[57] ABSTRACT

A method of forming low resistivity conductive lines on a semiconductor substrate is disclosed. In practicing the method a multichamber tool is used to advantage by forming a first doped polysilicon layer on the surface of a substrate, forming a second undoped layer on the doped layer, while maintaining the work piece under a vacuum environment, moving the substrate to a second chamber and thereafter forming a silicide containing layer on the undoped polysilicon layer. Various techniques may be used to deposit either the polysilicon or the silicide layer such as sputtering may also be used. Practice of the method eliminates separation of silicide from polysilicon and increases product yield.

8 Claims, 1 Drawing Sheet

METHOD OF FORMING A LOW STRESS POLYCIDE CONDUCTORS ON A SEMICONDUCTOR CHIP

BACKGROUND OF THE INVENTION

1. Field of the Invention

This invention relates generally to the formation of conductive members for semiconductor substrates and more particularly to the formation of gate conductors for field effect semiconductor devices including polysilicon and silicide layers.

2. Description of the Prior Art

Semiconductor wafer processing generally includes not only the placing of dopants into the body of the semiconductor wafer but also includes the deposition of one or more layers of different materials on the surface of the wafer. These layers may be either insulating, conductive or semiconductive.

In the formation of multi-layered devices it has been found that a desired deposited or formed layer can be affected not only by abutting layers but can also be affected by the process and apparatus used to form or deposit the desired layer.

As semiconductive devices made by such processes become smaller and more complex any changes induced by either the apparatus or method used or the character of abutting layers become more acute and can have greater effects on the final device characteristics than expected.

For example, in Complementary Metal-Oxide-Silicon (CMOS) Field Effect Transistor ( VET) device pairs the use of silicided polysilicon gates is preferred because the silicide reduces the sheet resistance of the doped polysilicon gate conductor thus improving the speed at which the FET can be operated.

There are two, generally practiced, processes for forming these silicide layers. The first is a self aligned silicide (salicide) process in which a silicon wafer is coated with insulating oxide or nitride layers which are then patterned to expose or uncover potions of the underlying silicon or polysilicon. Following this patterning step, a silicide forming metal layer such as titanium or cobalt is deposited over entire wafer so that portions of the deposited metal layer abut the exposed silicon. This metal layer is then annealed, i.e., heated, to cause the formation of a silicide wherever silicon and the metal come in contact. During the annealing process the silicon and the abutting metal react to form a silicide, e.g., titanium silicide ($TiSi_x$) or cobalt silicide ($CoSi_x$) where x is the ratio of silicon to refractory metal, usually in the range of 2 to 3.5. The regions of the deposited metal layer overlying the insulating layer remains unreacted and after the annealing is completed and the unreacted metal may be removed by well known processes.

The above described salicide process is limited to the types of metals that can be used and further can produce only a limited thickness of silicide. These limitations preclude the formation of silicides with the lowest possible sheet resistance. This means that, when the silicide is used as the gate contacts, the final device speed, which is related to the gate sheet resistance, is also limited. Furthermore, if this annealing process is used to simultaneously form conductive lines on the wafer surface, the minimum width of the separation between such lines is limited to that width which will not be bridged by the formation of adjacent silicides. Any such bridging that does occur will cause short circuits between the bridged lines. Although such bridging may be later removable by laser trimming, added additional inspection, processing and testing steps, which in many cases are cost prohibitive, are required.

The second siliciding process is one in which a silicon wafer is coated with a polycrystalline silicon layer, cleaned with a vapor of hydrofluoric (HF) acid and coated with a chemically vapor deposited or physically vapor deposited metal silicide layer. Doping, usually phosphorus, is typically introduced into the polysilicon or silicide layer followed by an anneal at about 900 degrees Centigrade to distribute and activate the dopant.

Although this process produces a lower resistivity silicide, it also consists of many discrete steps, is expensive and also produces high defect densities as compared to the first described process. Also, during subsequent, required processing steps, such as oxidization and silicide transformation anneals, voids can be created in the underlying phosphorous doped polycrystalline layer. Further, if the HF acid oxide removal step allows any oxides to remain on the underlying polysilicon surface, the formed metal silicide layer will not adhere well to the polysilicon surface and will allow the silicide to lift off the surface of the underlying polysilicon layer during subsequent processing steps. Both of these effects have significant impact on device yield resulting in increased device cost.

It is thus highly desirable to have a process in which the all the above described limitations of the prior art processes are eliminated.

SUMMARY OF THE INVENTION

The present invention is directed to a process for forming polysilicon gate conductors in which the thickness limitations and hence the sheet resistance limitations of the prior art processes are significantly reduced or eliminated.

Further, the present invention permits the use of different low resistance metals which when silicided result in gate contacts with a sheet resistance hitherto unattainable.

The present invention is directed towards a process for forming a conductive area on the surface of a semiconductor which conductive area has a sheet resistance lower than and higher thermal stability than that of titanium silicide or cobalt silicide.

The present invention is further directed towards a process for forming a conductive area on the surface of a semiconductor which conductive area is substantially stress free.

Still further the process of the present invention results in the formation of a conductive layer of silicide in which the percentage of the selected metal remains substantially uniform over its entire thickness at about 33 percent of the total content of the silicide layer and the silicon content thereof remains at about 67 percent.

The present invention achieves these desirable ends by overcoating a doped polycrystalline layer with an undoped polycrystalline layer and forming the silicide thereon in a non-oxidizing environment.

The present invention broadly comprises a method of forming a conductive area on the surface of a semiconductor substrate comprising the steps of: placing a semiconductor substrate within a deposition chamber and depositing thereon a doped polycrystalline silicon layer on the surface of the substrate, overcoating the doped polycrystalline layer with an undoped polycrystalline layer and forming a silicide on the undoped polycrystalline layer.

DETAILED DESCRIPTION OF THE PREFERRED EMBODIMENT

Figure 1:
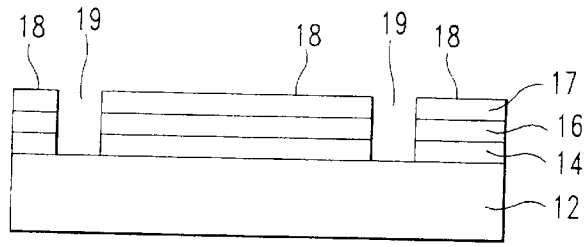
FIG. 1 illustrates, in cross-section, a typical gate stack structure for a field effect transistor fabricated on the surface of a semiconductor substrate in accordance with the present invention showing the various layers present.

FIG. 1 illustrates, in cross-section, a typical silicided polysilicon structure for a field effect transistor fabricated on the surface of a semiconductor substrate 12 in accordance with the present invention.

Broadly described, the process of fabricating this silicided polysilicon structure requires, in accordance with the present invention, selecting a partially processed semiconductor substrate 12 and depositing on its upper surface a polycrystalline silicon layer 14 doped with phosphorus atoms. Over this doped polycrystalline silicon layer 14 an undoped polycrystalline silicon layer 16 is deposited. A silicide layer 17 is formed on the surface of the undoped polycrystalline layer 16 as will be described below. The underlying substrate can include FET gate dielectric, exposed crystalline silicon, or field dielectric layers upon which it is desired to form a silicided polysilicon interconnect layer.

After the formation of the silicide layer 17, it and the underlying layers are etched to form a desired configuration of the conductor on the substrate surface. In FIG. 1 the desired configuration is illustrated by a plurality of islands 18 separated by etched channels 19. It should be understood that the configuration can be formed into conductive lines, FET gates, single crystal regions or other necessary elements as is well known to the art.

Preferably, the process of the present invention is performed in a so called clustered multi-chambered deposition tool, such as an Applied Materials Model 5200 Centura tool. The tool consists of a plurality of processing chambers coupled to a common central chamber in which different atmospheres can be maintained without removing semiconductor wafers to be processed from the tool. Since this apparatus is presently readily available in the marketplace and is a staple in commerce any further or detailed description is not deemed necessary.

The process of the present invention will now be described as it would be performed in the above described Applied Materials Centura 5200 deposition tool.

Figure 2:
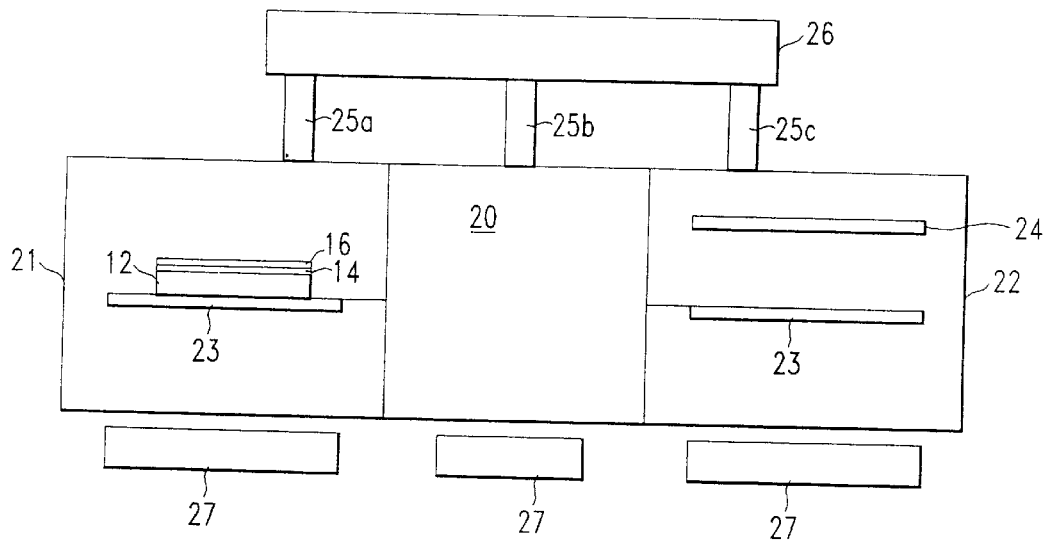
FIG. 2 depicts schematically, in cross-section, a simple multi-chambered tool used in the present process with the wafer being processed in a first chamber.

A simple schematic of such a tool is shown in FIG. 2 and basically comprises a transfer station 20 and two adjacent processing chambers 21 and 22. These chambers 20, 21 and 22 are arranged such that all can have either the same atmosphere therein or each can have a different unique atmosphere maintained therein. The tool is built such that the semiconductor wafers or substrates can be transferred from one chamber to the another without going outside the tool or the atmosphere maintained therein.

In the process of the present invention, the wafer 12 is placed in the transfer station 20 and the transfer station and the chambers 21 and 22 are flushed with about a 600 SCCM flow of an inert gas such as argon (Ar) from a gas distribution system 26. As is common in such tools, the gas distribution system is designed to contain all the gases used in the process and is coupled to all the chambers, via connecting inlet ports 25a, 25b and 25c so that selected flows of various gasses can be selectively introduced into the respective chambers. It will be understood that inlet ports 25 consist of multiple separate conduits each for providing a different gas to its respective chamber.

The silicon wafer or substrate 12 is then placed in the first chamber 21 and held in a fixed position, by a suitable support 23. The chamber is sealed and evacuated. The wafer is next heated to about 650° C. The pressure in the chamber 21 is, at this time, permitted to rise to 80 Torr. Reactant gases including about 50 SCCM flow of dopant gas such as phosphine and about 500 SCCM of silane from the gas distributions system 26, is now introduced in to the chamber 21 for a period of about 120 seconds to form, on the surface 12 of the wafer 10, a polysilicon layer 14 approximately 185 nanometers (nm) thick. This layer 14 preferably is in situ doped with phosphorous to a density of approximately $3 \times 10^{20}$ phosphorus atoms/cm$^3$.

Once the desired thickness of doped polysilicon is achieved the phosphorus gas flow is terminated.

In the prior art process once the wafer was coated with the doped polysilicon layer 12 it would have been removed from the tool and sent to a separate tool to deposit the refractory metal layer and form the silicide layer thereon. When a wafer, coated with a polysilicon layer 14, is so removed and exposed to the room environment an oxide layer is quickly and naturally formed on the surface of the doped polysilicon layer 14. It was this oxide layer that the hydrofluoric acid (HF) vapor step described above was intended to remove.

The present inventors have discovered that, even if the surface of the polysilicon was so cleaned, a silicide formed thereon may not adhere well.

The present invention by maintaining the wafer being treated in the same apparatus and maintaining the substrate in a chemically inactive, non-oxidizing environment during transfer between stations will prevent the creation of deleterious oxides on the surface of the doped polysilicon. Preventing the formation of the oxides eliminates the problems associated with the removal thereof.

The present inventors further discovered that the formation of a silicide directly on the surface of the doped polysilicon layer caused the tungsten silicide to become very tungsten rich at the polysilicon interface. When the tungsten silicide is annealed to transform it from the high resistance hexagonal as-deposited form to the low resistance tetragonal crystal phase, large voids can be created in the doped polysilicon layer which further affected the adhesion of the silicide to the underlying polysilicon. In addition, tungsten rich tungsten silicide films become very tensile during the transformation anneal, resulting in cracking and separation of the silicide from the polysilicon layer.

The present invention solves these problems by maintaining the wafer in the chamber 21 after the formation of the phosphorous doped layer 14 and immediately forming an undoped polysilicon layer 16 on the surface of the doped layer 14. By interposing this undoped layer 16 between the doped layer 14 and the subsequently deposited metal overcoating, without removing the wafer from the tool, better nucleation and adhesion of the formed silicide is realized and the voids encountered in the prior art process are avoided or eliminated.

Thus, the wafer 10, now coated with the layer 14, is left in the tool and a new sufficiently thick undoped polysilicon layer 16, having a thickness thicker than about 30 nm, is immediately formed on the surface of the doped polysilicon layer 32. The thickness of undoped polysilicon is selected to ensure that the silicide-forming metal will substantially react only with undoped polysilicon.

This undoped polysilicon layer 16 is formed over the doped layer 14 by maintaining, after the source of phosphorous is shut off, the flow of silane gas for an additional 15 seconds. This silane flow forms the layer 16 of undoped polysilicon to a thickness of approximately 45 nanometers.

Once the undoped polysilicon layer 16 is grown to the desired thickness the flow of silane is shut off and the transfer station 20 and the chambers 21 and 22 are again flooded with a flow of 800 SCCM of an inert or non-oxidizing atmosphere such as argon to flush any residual gases therefrom.

It is preferred, but not required, to allow the polysilicon coated substrate to cool down to near the temperature at which the silicide forming metal or silicide is formed.

Figure 3:
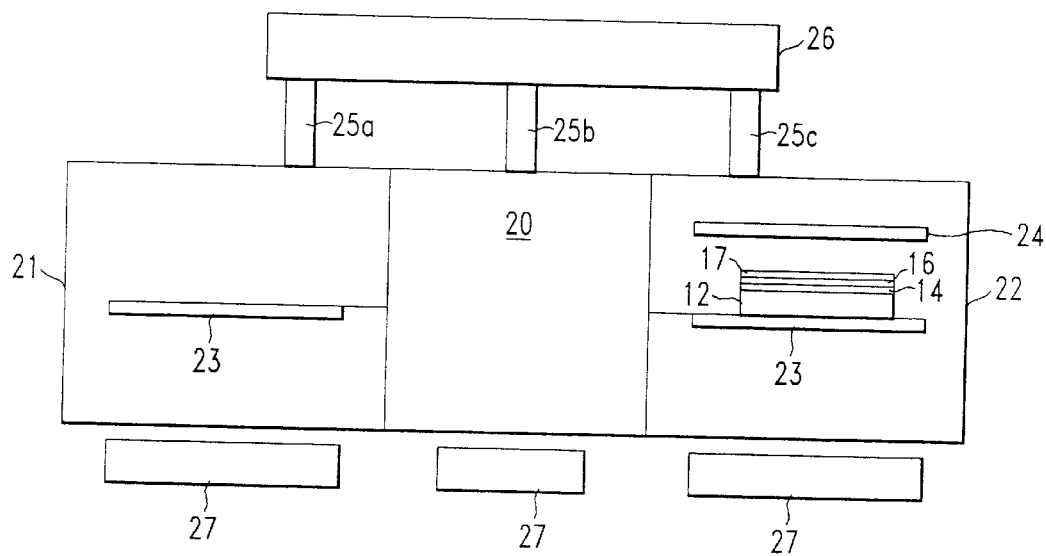
FIG. 3 depicts schematically the chambered tool shown in FIG. 2 with the wafer being processed in a second chamber.

The wafer is now transferred from the first chamber 21 through the transfer station 20 into the second chamber 22 without exposing the treated wafer to any chemically active materials or environment. The wafer is shown in chamber 22 in FIG. 3.

Alternatively, the wafer can be cooled while still maintaining the low pressure, non-oxidizing environment in a cool down station, not shown but part of the Centura tool, prior to transfer to the second deposition chamber 22. This step will reduce considerably the time required to cool the substrate to a temperature suitable for processing in the silicide forming metal deposition chamber.

The silicon substrate 12, now coated with the layer 14 of doped polysilicon and overcoated with the undoped polysilicon layer 16, is then placed in the second chamber 22, held in a fixed position near the gas distribution plate or manifold 25c. The chamber is sealed and evacuated. An inert gas from gas supply 26, such as argon at one atmosphere, is introduced therein through inlet 25c at a flow rate of about 600 SCCM while the temperature of the chamber is maintained at 550° C. The wafer is held at this temperature for a period of at least 45 seconds in order to stabilize the substrate temperature. .

Once the substrate has been stabilized, the flow of argon is maintained and about 175 SCCM of gaseous dichlorosilane (DCS) together with 3.5 SCCM of gaseous tungsten hexafluoride is introduced into the chamber for a period of about 130 seconds. During the first 15 seconds of this operation tungsten silicide begins to nucleate directly on the undoped polysilicon layer 16 and during the remaining time the layer thickens to form a layer 17 about 250 nm thick on the undoped polysilicon layer 14.

Once the required thickness of the tungsten silicide is reached, the tungsten hexafluoride gas is shut off and the dichlorosilane gas is maintained at about 175 SCCM for about 25 seconds to passivate the surface 18 (FIG. 1) of the tungsten silicide layer 17.

When this passivation step is over, the dichlorosilane gas is shut off, but the argon is kept flowing, and the wafer is held in the chamber for an additional 20 seconds to purge the chamber of the diclorosilane gas. At the completion of this cycle the silicided wafer is allowed to cool and is removed from the tool for further treatment such as etching or the like.

The above described process eliminates the need for precleaning the surface of the doped polysilicon layer 14 and avoids the necessity of the ion implant step used in the prior art process.

The introduction of the undoped polysilicon layer 16 interposed between the silicide layer 17 and the phosphorus doped polysilicon layer 14 prevent large voids from appearing in the doped polysilicon layer 14 and prevents cracking or peeling of the tungsten silicide layer 17.

While the invention has been particularly described with respect to a preferred embodiment, it should be understood that one skilled in the art can, from the foregoing, readily make changes in form and detail of the invention without departing from the spirit and scope of the invention.

What is claimed is:

1. The method of forming a conductive line on the surface of a semiconductor substrate comprising the steps of:

a) providing a deposition environment including a tool having a plurality of adjacent deposition chambers;

b) placing a semiconductor substrate within a first deposition chamber;

c) depositing a polycrystalline silicon layer on the surface of the substrate at a substantially constant rate to form two layers, the first layer consisting of d) having a first thickness of substantially uniformly doped polysilicon on the surface of the substrate and the second layer consisting of an undoped polysilicon having a thickness substantially less than said first layer;

d) maintaining the substrate in a chemically inactive environment;

e) moving the substrate from the first chamber to a second chamber within the tool while maintaining the substrate in said chemically inactive environment and preventing the substrate from being exposed to a chemically active environment; and f) forming a conductive silicide layer on the undoped polycrystalline layer.

2. The method of claim 1 wherein:

said doped polycrystalline layer is formed by exposing said substrate simultaneously to silane and phosphorus gases; and maintaining said substrate at about 650° Celsius.

3. The method of claim 2 wherein there is further provided the step of shutting off said phosphorus gas after a selected period of time; and maintaining said substrate in said silane gas for an additional period to form said undoped polycrystalline layer.

4. The method of claim 1 wherein said silicided layer is formed by coating said substrate, coated with a dual layer doped and undoped polycrystalline silicon layer, with either chemical vapor deposited or physical vapor deposited tungsten silicide.

5. The method of claim 4 wherein the substrate, coated with a dual layer of doped and undoped polycrystalline silicon layer is exposed to gaseous dichlorosilane and tungsten hexafluoride.

6. The method of claim 4 wherein the substrate, coated with a dual layer of doped and undoped polycrystalline, is exposed to an atmosphere of argon and sputtered tungsten silicide.

7. The method of claim 1 wherein the chambers in said tool are heated to about 650° Celsius; said doped polycrystalline layer is formed by the steps of: establishing the pressure in said first chamber at about 80 Torr; exposing said substrate simultaneously to about 500 SCCM of silane and about 50 SCCM of phosphine for a period of about 120 seconds to form polycrystalline silicon doped with phosphorus to a density of approximately $3 \times 10^{20}$ phosphorus atoms/cm$^3$; and shutting off the phosphine gas after said 120 seconds and continuing silane flow for 15 seconds.

8. The method of claim 1 wherein:

the conductive silicide is formed by exposing said substrate in said second chamber to a flow of about 175

SCCM of gaseous dichlorosilane and a flow of about 3.5 SCCM of tungsten hexafluoride for a period of about 133 seconds; shutting off the tungsten hexafluoride after said about 133 seconds; and there is further provided the step of:

passivating the formed silicide by maintaining the about 175 SCCM flow of the gaseous dichlorosilane for an additional about 25 seconds after said tungsten hexaflouride is shut off.

* * * * *